United States Patent
Zhu et al.

(10) Patent No.: US 8,558,331 B2
(45) Date of Patent: Oct. 15, 2013

(54) MAGNETIC TUNNEL JUNCTION DEVICE

(75) Inventors: Xiaochun Zhu, San Diego, CA (US); Seung H. Kang, San Diego, CA (US); Xia Li, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 776 days.

(21) Appl. No.: 12/633,264

(22) Filed: Dec. 8, 2009

(65) Prior Publication Data
US 2011/0133299 A1 Jun. 9, 2011

(51) Int. Cl.
*H01L 29/82* (2006.01)

(52) U.S. Cl.
USPC ............ 257/421; 257/E27.006; 438/3

(58) Field of Classification Search
USPC ............ 257/421, E27.006; 438/3; 365/156, 365/158; 707/821
See application file for complete search history.

(56) References Cited

U.S. PATENT DOCUMENTS

| | | | |
|---|---|---|---|
| 7,027,619 B2 | 4/2006 | Pavlidis et al. | |
| 7,376,270 B2 | 5/2008 | Chen et al. | |
| 7,502,248 B2 * | 3/2009 | Lim | 365/158 |
| 2004/0208114 A1 | 10/2004 | Lao et al. | |
| 2004/0228528 A1 | 11/2004 | Lao | |
| 2005/0129331 A1 | 6/2005 | Kakiuchi et al. | |
| 2005/0184839 A1 | 8/2005 | Nguyen et al. | |
| 2005/0254287 A1 | 11/2005 | Valet | |
| 2006/0008173 A1 | 1/2006 | Matsugu et al. | |
| 2006/0066912 A1 | 3/2006 | Kagaya | |
| 2006/0095889 A1 | 5/2006 | Cote et al. | |
| 2006/0158704 A1 | 7/2006 | Kameyama | |
| 2006/0257039 A1 | 11/2006 | Matsuhira | |
| 2007/0041640 A1 | 2/2007 | Tabata et al. | |
| 2007/0071316 A1 | 3/2007 | Kubo | |
| 2007/0085911 A1 | 4/2007 | Nakamura | |
| 2007/0263429 A1 | 11/2007 | Yamamoto et al. | |
| 2008/0117305 A1 | 5/2008 | Rogers et al. | |
| 2009/0096042 A1 | 4/2009 | Rizzo et al. | |

FOREIGN PATENT DOCUMENTS

| | | |
|---|---|---|
| TW | 200828306 | 7/2008 |
| WO | WO2004015597 A1 | 2/2004 |

OTHER PUBLICATIONS

Worledge, D.C. "Single-Domain Model for Toggle MRAM", IBM Journal of Research and Development, Jan. 6, 2005, 13 pages.
Choi et al., "Significant reduction of coercivity without reduction of tunneling magnetoresistance ratio of CoFeB/MgO/CoFeB-based magnetic tunnel junction using sandwich-structured free layer", Applied Physics Letters, vol. 91, No. 17, Oct. 23, 2007, pp. 172507-172507, XP012099842, ISSN: 0003-6951, DOI: D01:10.1063/1.2801703.
International Search Report and Written Opinion—PCT/US2010/059541, ISA/EPO—Jul.12, 2011 (090297WO).

(Continued)

*Primary Examiner* — Roy Potter
(74) *Attorney, Agent, or Firm* — Sam Talpalatsky; Nicholas J. Pauley; Joseph Agusta

(57) ABSTRACT

A system and method of manufacturing and using a magnetic tunnel junction device is disclosed. In a particular embodiment, a magnetic tunnel junction device includes a first free layer and second free layer. The magnetic tunnel junction also includes a spin torque enhancement layer. The magnetic tunnel junction device further includes a spacer layer between the first and second free layers that includes a material and has a thickness that substantially inhibits exchange coupling between the first and second free layers. The first and second free layers are magneto-statically coupled.

37 Claims, 7 Drawing Sheets

(56) References Cited

OTHER PUBLICATIONS

Lee et al., "Effect of interlayer coupling in CoFeB/Ta/NiFe free layers on the critical switching current of MgO-based magnetic tunnel junctions", Journal of Applied Physics, vol. 106, No. 2, Jul. 29, 2009, pp. 24513-24513, XP012123656, ISSN: 0021-8979, DOI: D01:10.1063/1.3184423.
Taiwan Search Report—TW099142976—TIPO—May 23, 2013.

* cited by examiner

MAGNETIC TUNNEL JUNCTION DEVICE

I. FIELD

The present disclosure is generally related to magnetic tunnel junction devices.

II. DESCRIPTION OF RELATED ART

Magnetic Random Access Memory (MRAM) is a nonvolatile memory technology that uses magnetization to represent stored data. An MRAM generally includes a plurality of magnetic cells in an array. Each cell typically represents one bit of data. A cell includes a magnetic element, such as a magnetic tunnel junction (MTJ).

Ferromagnetic plates of an MTJ typically include a free layer and a pinned layer separated by a thin tunneling barrier layer. The plates are associated with a magnetization direction (or orientation of magnetic moments). In the free layer, the magnetization direction is free to rotate. An anti-ferromagnetic layer may be used to fix the magnetization of the pinned layer in a particular direction. A bit is written to the MTJ by changing the magnetization direction of one of the ferromagnetic plates of the MTJ. The resistance of the MTJ depends upon the orientations of the magnetic moments of the free layer and the pinned layer. By applying a switching current to the MTJ element, the magnetic polarization of the MTJ element can be changed from a logic "1" state to a logic "0" state or vice versa.

III. SUMMARY

Embodiments herein describe methods and devices for forming a magnetic tunnel junction (MTJ) device. According to an illustrative embodiment, an MTJ device is formed by depositing a first free layer of a magnetically permeable material on a tunneling barrier layer, depositing a spacer layer on the first free layer, depositing a second free layer on the spacer layer, and depositing a spin torque enhancement layer above the second free layer. The spacer layer is chosen of a material or materials and a thickness to substantially inhibit exchange coupling between the first and second free layers. However, the first free layer and the second free layer are strongly magneto-statically coupled. Thus, the magnetic polarizations of the first and second free layers are anti-parallel, regardless of whether the device is switched to a logic "1" state or a logic "0" state.

In a particular embodiment, an MTJ device is disclosed that has a first free layer having a first thickness, a second free layer, and a spin torque enhancement layer. The device also includes a spacer layer between the first free layer and the second free layer. The spacer layer is of a material and a thickness to substantially inhibit exchange coupling between the first and second free layers. The first free layer is magnetio-statically coupled to the second free layer. In another particular embodiment, the spacer layer can be of a combination of materials having a total thickness to substantially inhibit exchange coupling between the first and second free layers. The combination material may include two different non-magnetic materials or more than two different non-magnetic materials. In another particular embodiment, the spacer layer can be of multiple layers and have a total thickness to substantially inhibit exchange coupling between the first and second free layer. The spacer layer can include two non-magnetic layers made of different materials or more than two non-magnetic layers made of different materials.

In another particular embodiment, a method of manufacturing an MTJ device is disclosed. The method includes depositing a first free layer on a tunnel barrier layer of an MTJ structure. The first free layer includes a magnetically permeable material and has a first thickness. The method also includes depositing a spacer layer on the first free layer. The spacer layer includes a substantially non-magnetically permeable insulator material and has a thickness that substantially inhibits exchange coupling. The method further includes depositing a second free layer on the spacer layer. The second free layer includes a magnetically permeable material. The method further includes depositing a spin torque enhancement layer above the second free layer.

In another particular embodiment, a computer readable tangible medium stores instructions executable by a computer to facilitate manufacture of an MTJ device. The stored instructions are executable by the computer to control depositing of a first free layer on a tunnel barrier layer of an MTJ structure, the first free layer including a magnetically permeable material and having a first thickness. The stored instructions are executable by the computer to control depositing of a spacer layer on the first free layer. The spacer layer includes a substantially non-magnetically permeable insulator material having a thickness that substantially inhibits exchange coupling between the first free layer and a second free layer. The stored instructions are executable by the computer to control depositing of a second free layer on the spacer layer. The second free layer includes a magnetically permeable material. The stored instructions are executable by the computer to control depositing of a spin torque enhancement layer above the second free layer.

In another particular embodiment, a method of designing an MTJ device is disclosed. The method includes receiving design information representing at least one physical property of a semiconductor device. The semiconductor device includes a first free layer having a first thickness, a second free layer having a second thickness, a spin torque enhancement layer, and a spacer layer between the first free layer and the second free layer. The spacer layer includes a material or more than one material and has a thickness that substantially inhibits exchange coupling between the first and second free layers. The spacer layer may also include two or more than two non-magnetic layers made of different materials, and have a total thickness that substantially inhibits exchange coupling between the first and second free layers. The first free layer is magneto-statically coupled to the second free layer. The method further includes transforming the design information to comply with a file format and generating a data file including the transformed design information.

In another particular embodiment, a method of positioning a packaged MTJ device is disclosed. The method includes receiving design information including physical positioning information of a packaged semiconductor device on a circuit board. The packaged semiconductor device includes a semiconductor structure that includes a first free layer having a first thickness, a second free layer having a second thickness, a spin torque enhancement layer, and a spacer layer between the first free layer and the second free layer. The first free layer is magneto-statically coupled to the second free layer. The method further includes transforming the design information to generate a data file.

In another particular embodiment, a method of manufacturing a circuit board that includes a packaged MTJ device is disclosed. The method includes receiving a data file with design information including physical positioning information of a packaged semiconductor device on a circuit board. The method further includes manufacturing the circuit board configured to receive the packaged semiconductor device according to the design information. The packaged semiconductor device comprises a first free layer having a first thickness, a second free layer having a second thickness, a spin torque enhancement layer, and a spacer layer between the first free layer and the second free layer. The first free layer is magneto-statically coupled to the second free layer.

One particular advantage provided by disclosed embodiments is a lower switching current to change the state of an MTJ device. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
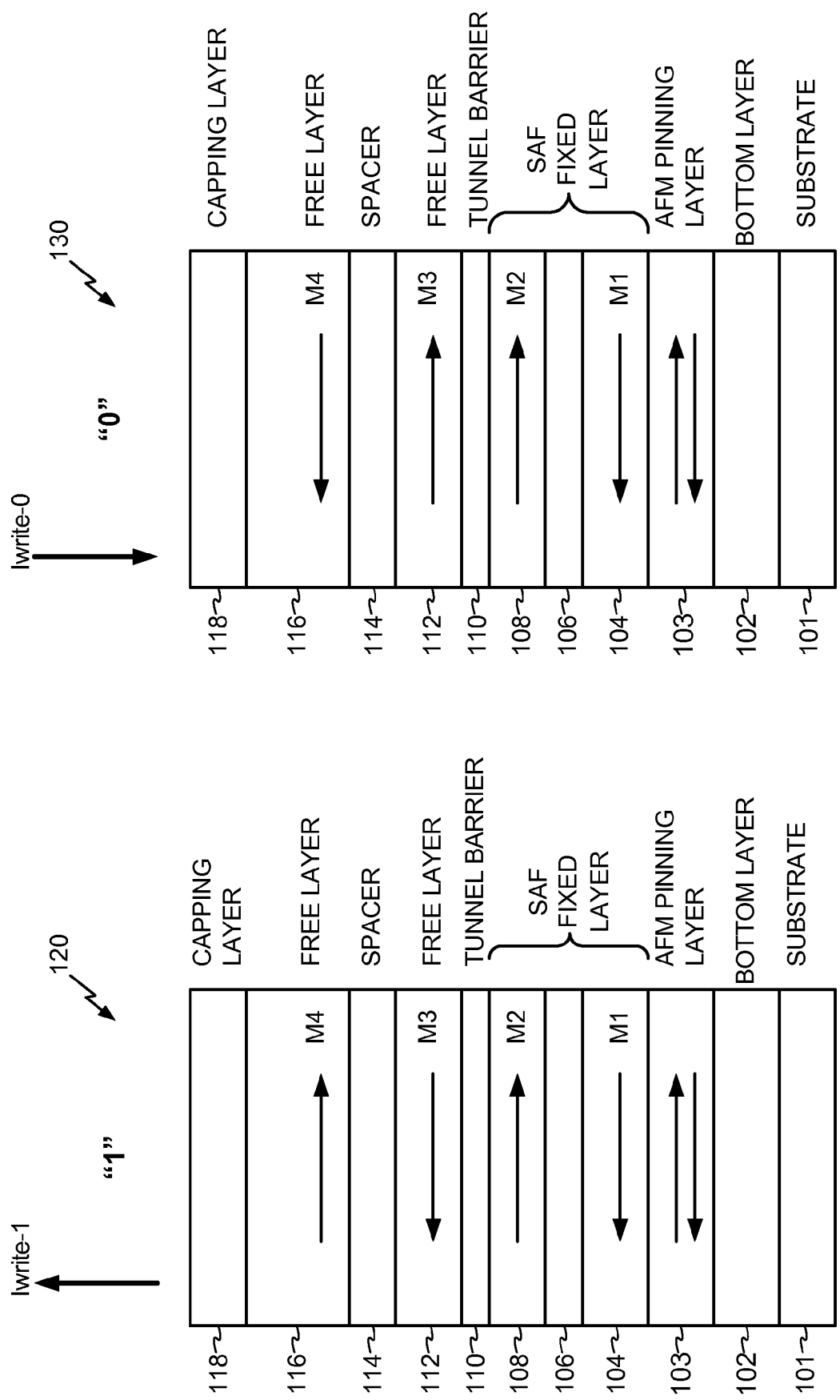
FIG. 1 is a cross sectional view of an embodiment of a magnetic tunnel junction (MTJ) device in a first state and in a second state.

FIG. 1 is a cross sectional view of an embodiment of an MTJ device in a first state 120, (logic "1"), and in a second state 130, (logic "0"). The embodiment of FIG. 1 includes multiple layers above a substrate 101. The substrate 101 may be a semiconductor substrate including, for example, silicon, germanium, or a compound semiconductor material. A first layer 102 above the substrate is a bottom layer which may form an electrode and include Ta. Ta provides better growing texture for an Anti-Ferromagnetic (AFM) pinning layer, and provides a smooth surface for growing the MTJ. The bottom layer can be composed of multiple layers of different materials. A layer 103 is an Anti-Ferromagnetic (AFM) pinning layer. The AFM pinning layer 103 acts to pin the magnetic moments in layers 104 and 108. The AFM pinning layer 103 may include an anti-ferromagnetic material such as MnPt, IrMn, FeMn, or NiO. An example thickness of the AFM pinning layer 103 is 15 nm. Other thicknesses may be employed for the AFM pinning layer 103.

The layers 104, 106 and 108 form a Synthetic Anti-Ferromagnetic (SAF) layer. The layer 104 is pinned by layer 103 by an exchange coupling mechanism.

The layer 108 is pinned to layer 104 by exchange coupling through a spacer layer 106. The spacer layer 106 may be Ru, Rh, or Cr or other material that does not substantially inhibit exchange coupling. The layers 104 and 108 are ferromagnetic and may include Fe, Ni, Co, or B, or a combination of these elements, such as, for example, CoFeB. The magnetic moments in layers 104 and 108 are anti-parallel, thus forming an anti-ferromagnetic layer. An example thickness of the SAF layer is 2 nm (nanometers) for layer 104, 0.9 nm for layer 106, 2 nm for layer 108. Other thicknesses may be employed for the SAF layer.

The layer 110 is a tunnel barrier layer that may be formed of a dielectric such as MgO. An example thickness of the tunnel barrier layer 110 is 1 nm. Other thicknesses may be employed for the tunnel barrier layer.

The layer 112 is a first free layer that is magnetizable and has a first thickness. The layer 114 is a spacer layer comprising a material and a thickness that substantially inhibits exchange coupling between the first free layer 112 and the second free layer 116. The spacer layer 114 may be composed of multiple layers or multiple materials such as an alloy. For example, the spacer layer may comprise one of AlCu, AlRu, and AlAg. As another example, the spacer layer may comprise two layers of one of Ta and MgO, Ta and Mg, and Ta and Ru. In some embodiments, the thickness of the spacer layer is at least 4 Angstroms ($4 \times 10^{-10}$ meters). The layer 116 is a second free layer that is magnetizable and may have a second thickness that is different from, or the same as, the thickness of the first free layer 112. In one embodiment, the thickness of the second free layer 116 is greater than the thickness of the first free layer 112. In some embodiments, the thickness of the first free layer 112 is between 5 and 25 Angstroms. In other embodiments, the thickness of the first free layer 112 is between 15 and 20 Angstroms. In some embodiments, the thickness of the second free layer 116 is between 10 and 60 Angstroms. In other embodiments, the thickness of the second free layer 116 is between 30 and 50 Angstroms. In some embodiments, a capping layer 122 is deposited on the second free layer 116. The capping layer 122 is a non-magnetic layer and forms a spin barrier or top electrode but is not a pinning layer.

In a logic "0" state, the magnetic polarizations of the two upper free layers 112, 116 are directed as shown at 130, and in the logic "1" state the magnetic polarizations of the two upper free layers 112, 116 are directed as shown at 120. The state of the MTJ device can be changed by applying a switching current across the device. In particular, a current Iwrite-1 applied through the MTJ device in one direction places the device in the logic "1" state, and a current Iwrite-2 applied in the opposite direction places the device in the logic "0" state. Thus, a magnetic tunnel junction device may be in a memory cell where a current applied across the magnetic tunnel junction device changes a data value stored in the cell. When the magnetic moment of the lower free layer 112 is aligned with the magnetic moment of a pinned upper layer 108 of the Synthetic Antiferromagnetic (SAF) layer, the resistance of the device is low and the device is in the logic "0" state. When the magnetic moment of the lower free layer 112 is aligned opposite of the magnetic moment of the upper pinned layer 108, the resistance of the device is high and the MTJ device is in the logic "1" state.

Figure 2:
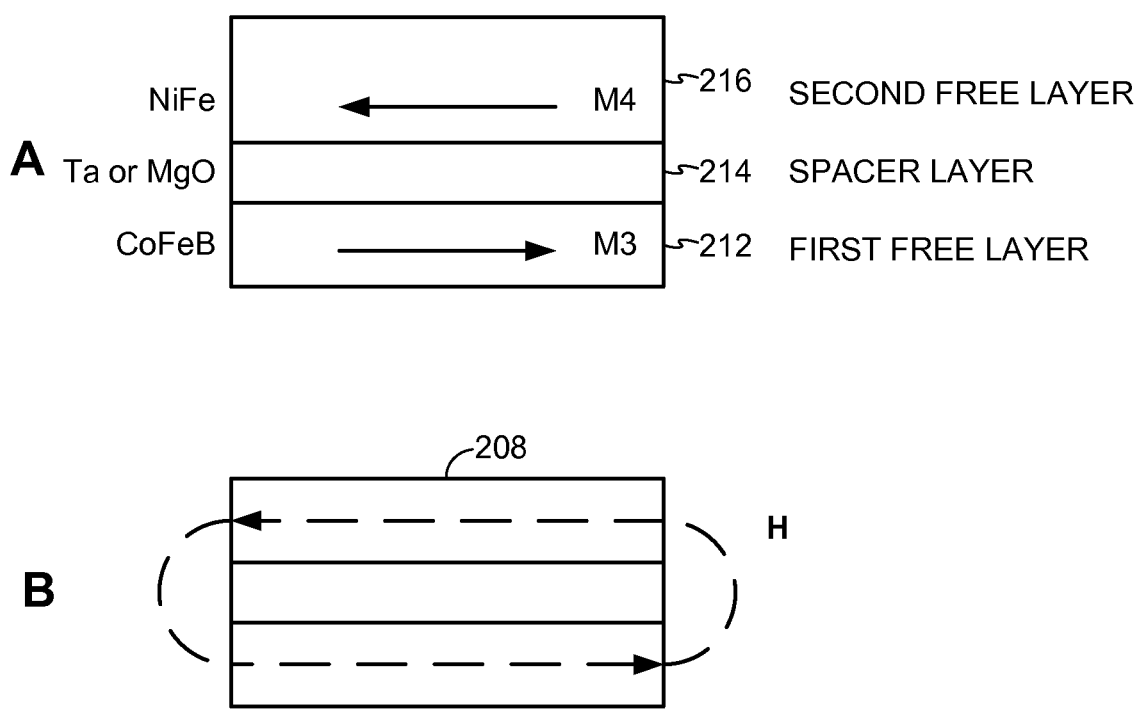
FIG. 2 is a cross sectional view of a first embodiment of a dual free layer structure of an embodiment of an MTJ device.

FIG. 2 shows a portion of a representative MTJ device that includes multiple free layers. A layer 212 is a first free layer that is magnetizable and has a first thickness. The layer 212 may include a ferrous alloy such as CoFeB. A layer 214 is a spacer layer formed of a dielectric such as Ta or MgO that substantially inhibits exchange coupling between the first free layer 212 and a second free layer 216. Exchange coupling may also be substantially inhibited by a thickness of the spacer layer 214. In some embodiments, the thickness of the spacer layer 214 is at least 4 Angstroms ($4 \times 10^{-10}$ meters). In other embodiments, the thickness of the spacer layer is at least 8 Angstroms. The layer 216 is a second free layer that may include a ferrous alloy such as NiFe. The second free layer 216 is magnetizable. The layer 214 may also be a multiple spacer layer formed of a multiple dielectrics such as Ta and MgO, Ta and Mg, Ta and Ru, but will not be limited to those materials.

As can be seen from FIG. 1 and FIG. 2, the magnetic moment, M3, in the first free layer 112, 212 is anti-parallel to the magnetic moment, M4, in the second free layer 116, 216. The magnetic moments in the first and second free layers are anti-parallel, regardless of the state of the MTJ device. The magnetic moments in the free layers are anti-parallel because they are magneto-statically coupled, but substantially not exchange-coupled, as shown by the dashed lines in FIG. 2 at 208. The dashed lines show a magnetic field, H, that is circuitous and couples the first and second free layers, magneto-statically.

A layer 212 is a first free layer that is magnetizable and has a first thickness. The layer 212 may include a ferrous alloy such as CoFeB. A layer 214 is a spacer layer formed of a dielectric such as Ta or MgO that substantially inhibits exchange coupling between the first free layer 212 and a second free layer 216. Exchange coupling may also be substantially inhibited by a thickness of the spacer layer 214. In some embodiments, the thickness of the spacer layer 214 is at least 4 Angstroms ($4 \times 10^{-10}$ meters). In other embodiments, the thickness of the spacer layer is at least 8 Angstroms. The layer 216 is a second free layer that may include a ferrous alloy such as NiFe. The second free layer 216 is magnetizable. The layer 214 may also be a multiple spacer layer formed of a multiple dielectrics such as Ta and MgO, Ta and Mg, Ta and Ru, but will not be limited to those materials.

Figure 3:
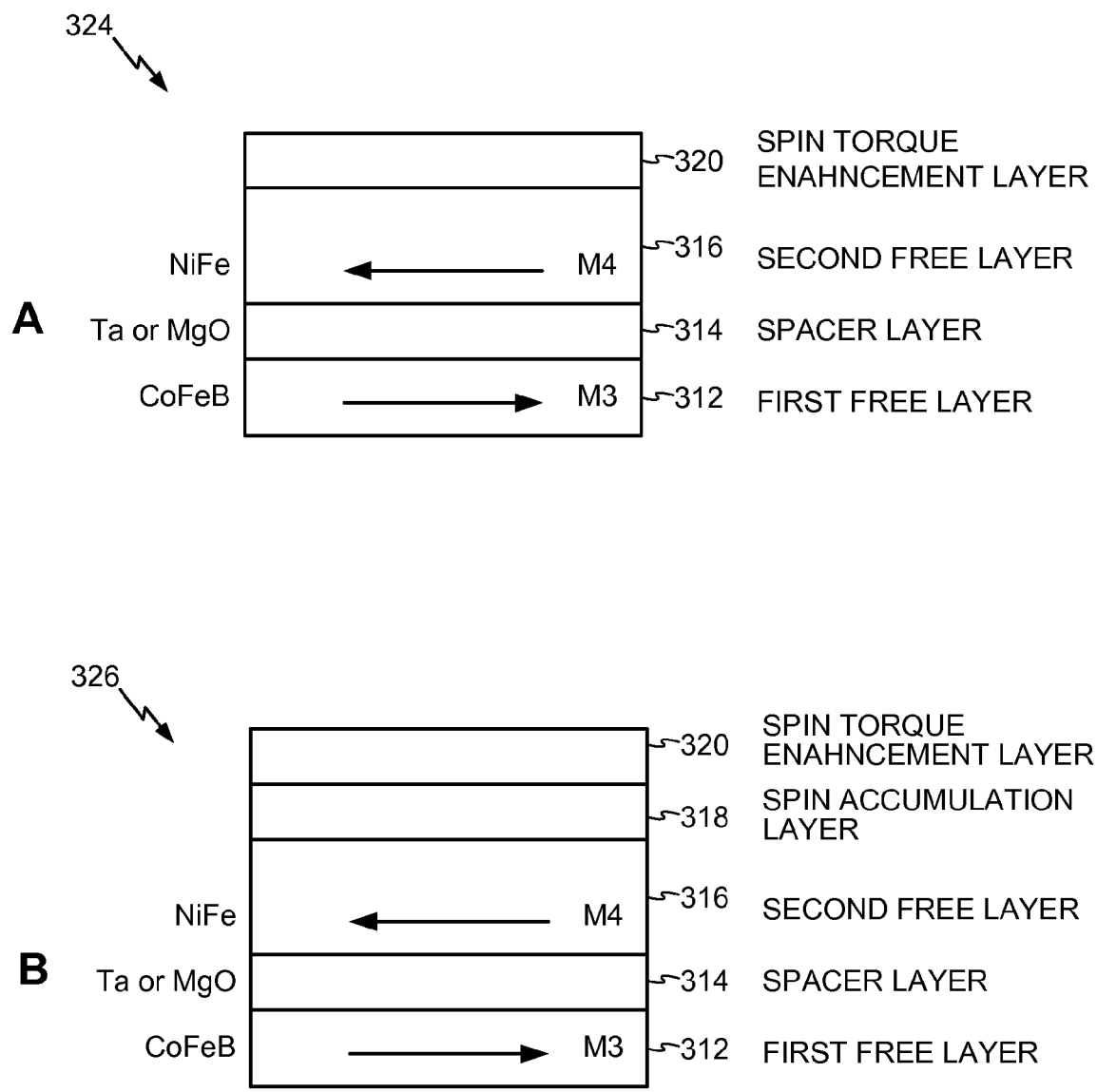
FIG. 3 shows a cross sectional view of a second embodiment and a third embodiment of a portion of a representative MTJ device.

FIG. 3 shows a second embodiment and a third embodiment of a portion of a representative MTJ device that includes two free layers 312 and 316 separated by a spacer layer 314. In the second embodiment of the portion of the MTJ device 324, a spin torque enhancement layer 320 is added above the second free layer 316. The spin torque enhancement layer 320 reduces a damping constant of the free layers. The spin torque enhancement layer 320 may include MgO, SiN, TaO, or other suitable material. In the third embodiment of the portion of the MTJ device 326, a spin accumulation layer 318 is added between the second free layer 316 and the spin torque enhancement layer 320. In some embodiments, the spin accumulation layer 318 has a high conductivity and a long diffusion length that may cause accumulation of angular momentum. The spin accumulation layer may include Mg, Cu, Al, or other suitable material.

Figure 4:
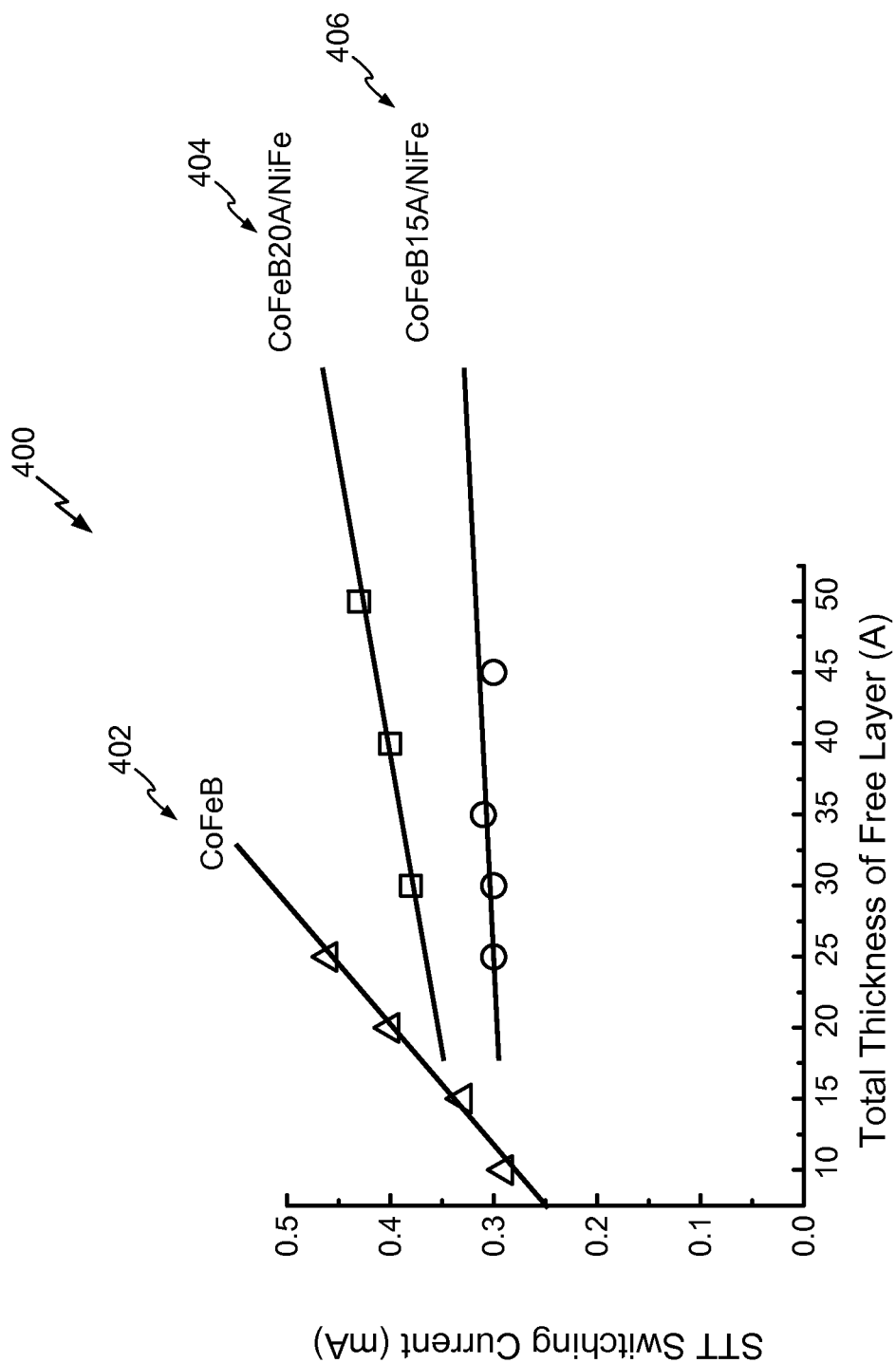
FIG. 4 is a graph showing switching current versus layer thickness of embodiments of MTJ devices.

FIG. 4 is a graph 400 showing switching current versus layer thickness of embodiments of different MTJ devices. Line 402 indicates switching current as a function of thickness of a first free layer in an embodiment of an MTJ that does not include a second free layer. Line 404 indicates switching current as a function of thickness of an embodiment of an MTJ device that includes first and second free layers. More specifically, the first free layer includes CoFeB having a thickness of 20 Angstroms ($20 \times 1^{0-10}$ meters). The second free layer includes NiFe. Line 406 indicates switching current as a function of thickness of another embodiment of an MTJ device having two free layers. The first free layer includes CoFeB having a thickness of 15 Angstroms and the second free layer includes NiFe.

In reference to FIG. 4, a lower switching current can be achieved at greater free layer thickness with MTJ devices that include a second free layer over a spacer, as shown in FIG. 1 and FIG. 2. The switching current grows more slowly as a function of the thickness of the first free layer. In particular, having a CoFeB first free layer that is 15 Angstroms thick and a second free layer that has a total thickness of between 25 and 50 Angstroms yields a switching current of about 300 micro-amperes. In an MTJ device that does not include the second free layer, line 402 shows that the switching current exceeds 400 micro-amperes when the thickness of the free layer, CoFeB, exceeds 25 Angstroms. Thus, in certain circumstances, a lower switching current is required to change the state of the device, when a second free layer is present. In some embodiments, the first free layer has a thickness in the range of 5 to 25 Angstroms, and the second free layer has a thickness in the range of 10 to 60 Angstroms. In other embodiments, the first free layer has a thickness in the range of 15 to 20 Angstroms, and the second free layer has a thickness of 30-50 Angstroms. In some embodiments, the thickness of the spacer layer is in the range of 0.4-30 Angstroms.

Thus, the presence of a second free layer that is magneto-statically coupled to the first free layer, but substantially not exchange coupled to the first free layer, can provide an advantage of a lower switching current of the MTJ device to change the state of the device. The presence of the second free layer also increases an energy barrier to a movement of electrons away from the first free layer, resulting in greater efficiency. The presence of the second free layer may also reduce magneto-striction in the first free layer, thereby improving the switching uniformity of the MTJ device.

Figure 5:
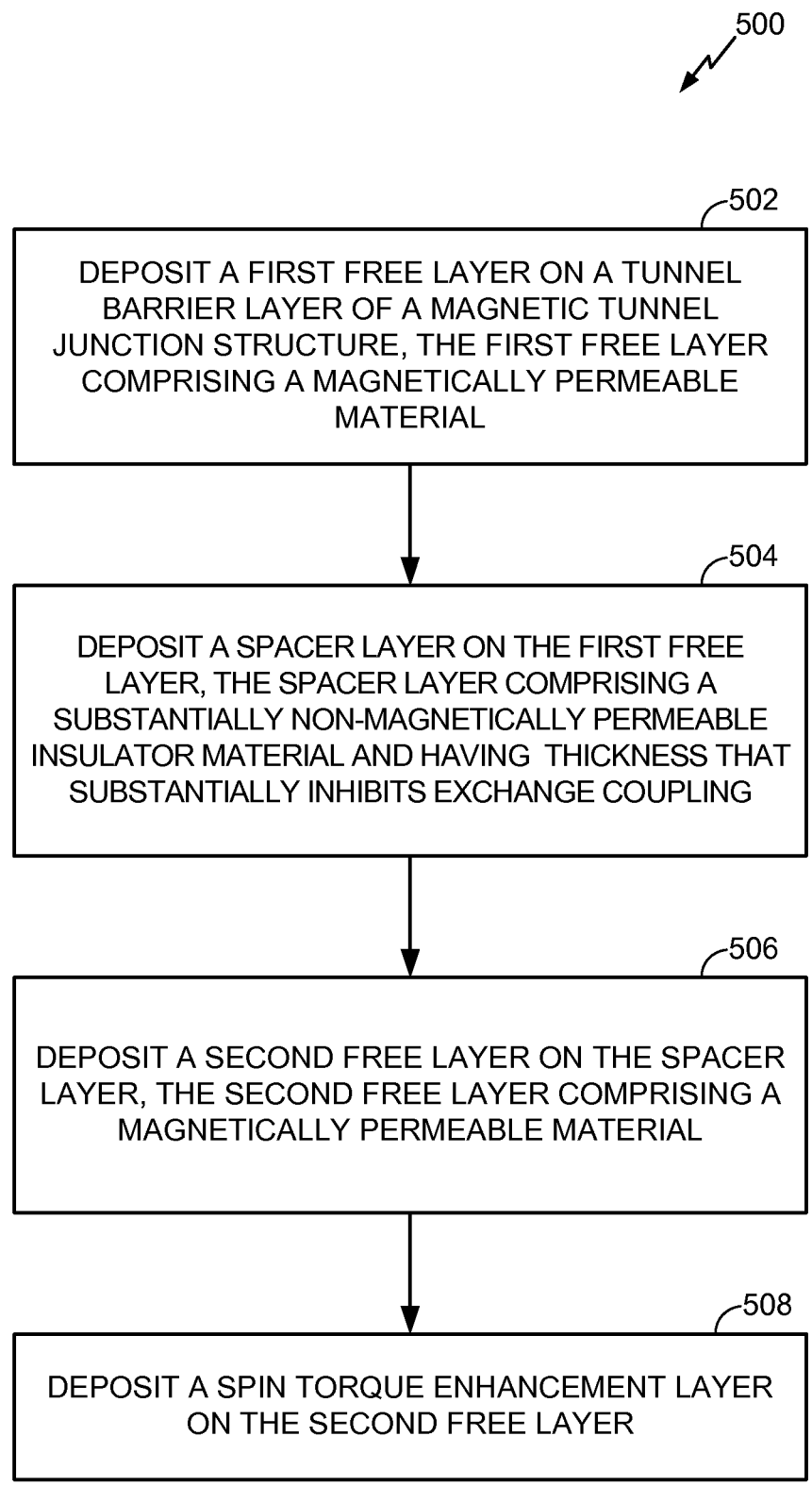
FIG. 5 is a flow chart of an embodiment of a method of forming an MTJ device.

FIG. 5 is a flow chart 500 of an embodiment of a method of forming an MTJ device. Beginning at 502, a first free layer including a magnetically permeable material is deposited on a tunneling barrier layer of an MTJ structure. The first free layer has a first thickness. For example, a layer of CoFeB can be deposited onto a tunnel barrier layer as shown in FIG. 1, (layer 112). Advancing to 504, a spacer layer that is substantially non-magnetically permeable is deposited on the first free layer. The spacer layer is an insulator material having a thickness that substantially inhibits exchange coupling between the first free layer and a second free layer deposited upon the spacer layer. For example, a layer of Ta or MgO can be deposited onto the first free layer as shown in FIG. 1, (layer 114). The spacer layer may itself be a multilayer structure that includes materials such as TaMg, TaRu, MgOTa, MgTa, or RuTa. Moving to 506, a second free layer including a magnetically permeable material is deposited on the spacer layer. For example, a layer of NiFe can be deposited onto the spacer layer as shown in FIG. 1, layer 116. Advancing to 508, a spin torque enhancement layer is deposited on or above the second free layer.

Thus, some embodiments include a method of manufacturing a magnetic tunnel junction device. The method includes depositing a first free layer on a tunnel barrier layer of a magnetic tunnel junction structure, the first free layer including a magnetically permeable material and having a first thickness. The method also includes depositing a spacer layer on the first free layer, the spacer layer including a substantially non-magnetically permeable insulator materials and having a second thickness that substantially inhibits exchange coupling between the first free layer and a second free layer. The method also includes depositing a second free layer on the spacer layer, the second free layer including a magnetically permeable material. The method also includes depositing a spin torque enhancement layer on or above the second free layer.

Figure 6:
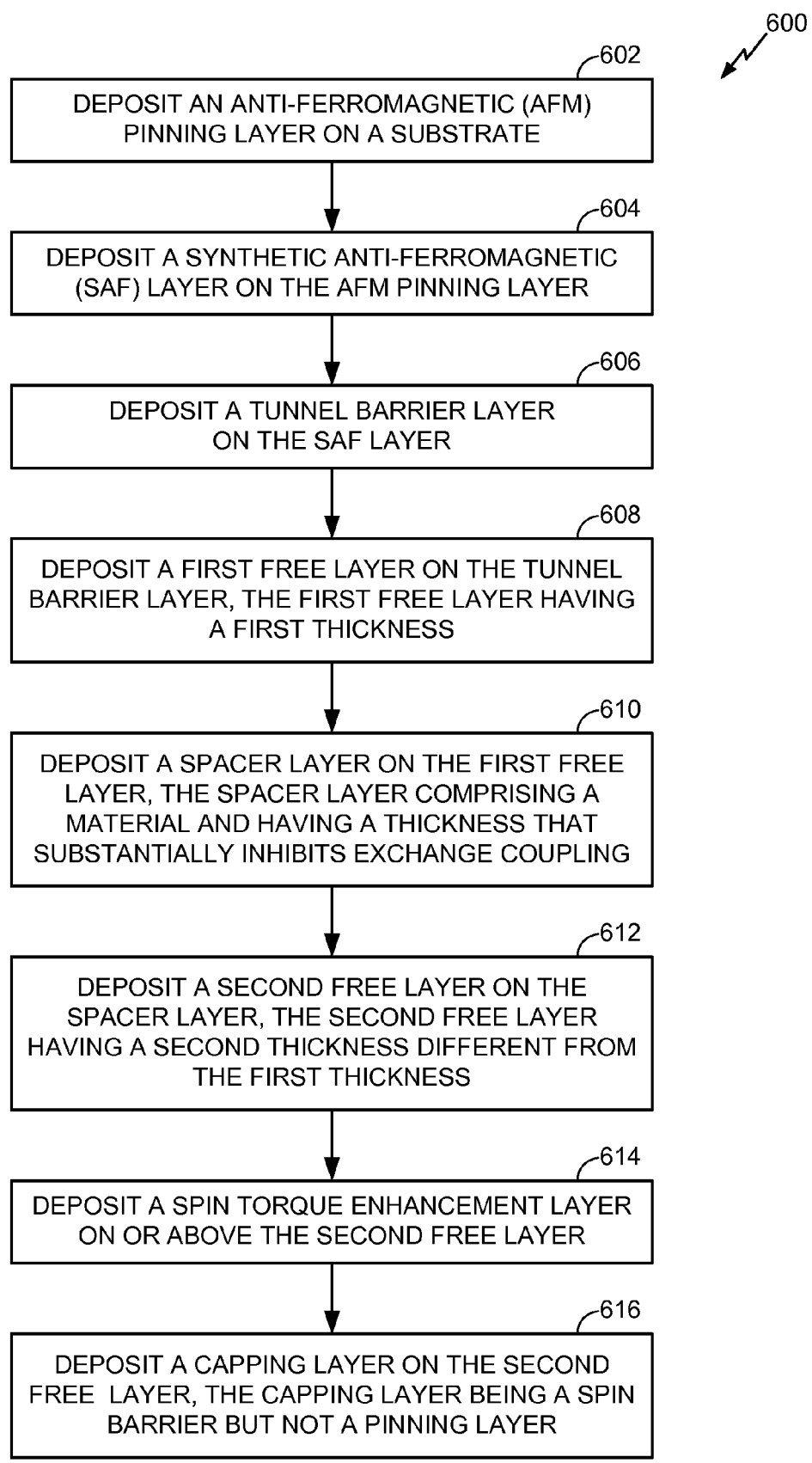
FIG. 6 is a flow chart of another embodiment of a method of forming an MTJ device.

FIG. 6 is a flow chart 600 of another illustrative embodiment of a method of forming an MTJ device. Starting at 602, an anti-ferromagnetic (AFM) pinning layer is deposited on a substrate, (e.g., substrate 101 of FIG. 1). As shown in FIG. 1, a bottom layer may be deposited on the substrate before depositing the AFM layer. Advancing to 604, a synthetic anti-ferromagnetic (SAF) layer is deposited on the AFM pinning layer. For example, the SAF layer 104, 106, and 108, may be deposited on the AFM pinning layer 102, as shown in FIG. 1. Moving to 606, a tunnel barrier layer is deposited on the SAF layer, (e.g., layer 110 of FIG. 1 may be deposited on layer 108). Continuing at 608, a first free layer is deposited on the tunnel barrier layer, the first free layer having a first thickness, (e.g., layer 112 of FIG. 1). Progressing to 610, a spacer layer is deposited on the first free layer, as shown for layer 114 of FIG. 1. The spacer layer is of a material or materials and has a thickness that substantially inhibits exchange coupling between the first free layer and a second free layer. Advancing to 612, a second free layer (e.g., layer 116 of FIG. 1) is deposited on the spacer layer. The presence of the second free layer that is magneto statically coupled, but substantially not exchange coupled, to the first free layer, results in a lower switching current to change the state of the MTJ device. Advancing to 614, a spin torque enhancement layer is deposited on or above the second free layer. Moving to 616, a capping layer is deposited on the second free layer. The capping layer, (e.g., layer 122 of FIG. 1) forms a spin barrier or top electrode but is not a pinning layer. The capping layer 122 may be formed of Ta, TaN, or Ru. An example thickness of the capping layer is 0.2-200 nm.

Note that any one or more of the layers described herein may be deposited using a vapor deposition process, a vacuum evaporation process, or other suitable deposition process.

An MTJ device as described herein may be located in each one of a plurality of memory cells forming an array of Magnetic Random Access Memory. In one embodiment, the MTJ devices are in cells of a Spin-Transfer-Torque Magnetic Random Access Memory (STT-MRAM). In each cell of the memory array, an MTJ device is placed in one state to store a logic "1" value and is placed in an opposite state to store a logic "0" value. A memory cell may be placed in one state or the other by applying a current across the MTJ device forming the cell.

The foregoing disclosed MTJ and memory devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in electronic devices.

Figure 7:
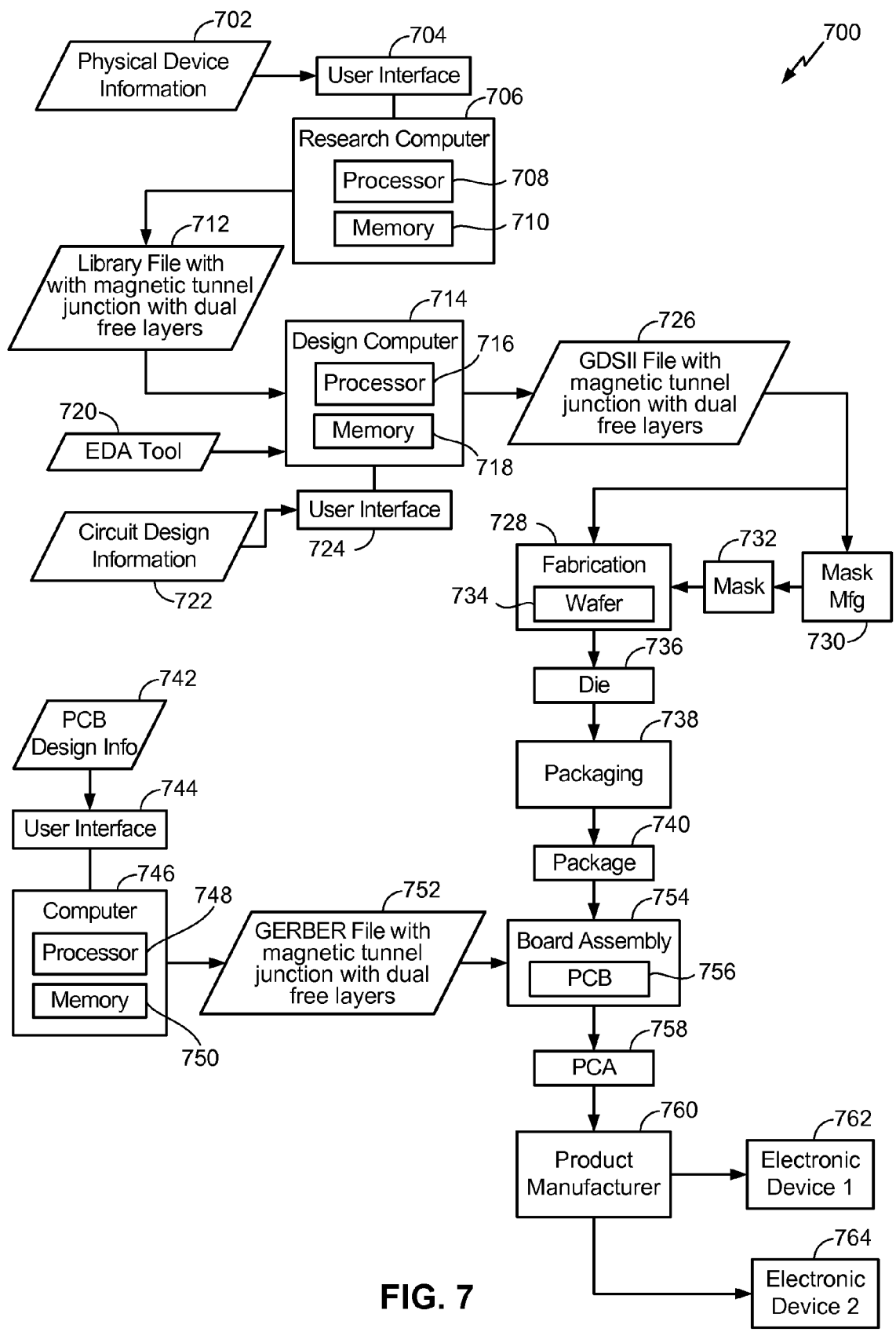
FIG. 7 is flow chart of an embodiment of a design and manufacture process of a semiconductor device that includes an embodiment of an MTJ device.

FIG. 7 depicts a particular illustrative embodiment of an electronic device manufacturing process 700. Physical device information 702 is received in the manufacturing process 700, such as at a research computer 706. The physical device information 702 may include design information representing at least one physical property of a semiconductor device, such as memory devices including memory cells including the MTJ device with dual free layers as illustrated in FIG. 1 and FIG. 2. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices, including the MTJ device, or memory arrays including MTJ devices with dual free layers as shown in FIG. 1 or FIG. 2, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit using the MTJ device with dual free layers of FIG. 1 or FIG. 2 of the library file 712. For example, a user of the design computer 714 may enter circuit design information 722 via a user interface 724 coupled to the design computer 714. The circuit design information 722 may include design information representing at least one physical property of a semiconductor device, such as the MTJ device of FIG. 1 or FIG. 2. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722 to comply with a file format. To illustrate, the file format may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the MTJ device with dual free layers of FIG. 1 or FIG. 2. To illustrate, the data file may include information corresponding to a system-on-chip (SOC) that includes the MTJ device with dual free layers of FIG. 1 or FIG. 2 and that also includes additional electronic circuits and components within the SOC.

The GDSII file 726 may be received at a fabrication process 728 to manufacture the MTJ device of FIG. 1 or FIG. 2, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a circuit including the MTJ device of FIG. 1 or FIG. 2.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board. The packaged semiconductor device corresponds to the package 740 including the MTJ device with dual free layers of FIG. 1 or FIG. 2.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the MTJ device with dual free layers of FIG. 1 or FIG. 2. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. The disclosure is not limited to these exemplary illustrated units. Embodiments of the disclosure may be suitably employed in any device that includes active integrated circuitry including memory.

Thus, the MTJ device of FIG. 1 or FIG. 2 may be fabricated, processed, and incorporated into an electronic device, as described in the illustrative process 700. One or more aspects of the embodiments disclosed with respect to FIGS. 1-2 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), including MRAM and STT-MRAM, flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. The present disclosure is not intended to be limited to the embodiments shown herein but is to be accorded the widest scope possible consistent with the principles and novel features as defined by the following claims.

What is claimed is:

1. A magnetic tunnel junction device, comprising:
 a semiconductor device comprising:
  a first free layer;
  a second free layer;
  a spin torque enhancement layer; and
  a spacer layer between the first free layer and the second free layer, the spacer layer comprising a material and having a thickness that substantially inhibits exchange coupling between the first free layer and the second free layer, and
  wherein the first free layer is magneto-statically coupled to the second free layer, and
  wherein the thickness of the spacer layer is at least 4 Angstroms.

2. The magnetic tunnel junction device of claim 1, wherein the first free layer comprises CoFeB.

3. The magnetic tunnel junction device of claim 1, wherein the second free layer comprises NiFe.

4. The magnetic tunnel junction device of claim 1, further comprising a Synthetic Anti-Ferromagnetic (SAF) layer.

5. The magnetic tunnel junction device of claim 4, further comprising an Anti-Ferromagnetic (AFM) pinning layer to pin a direction of a magnetic field in the SAF layer.

6. The magnetic tunnel junction device of claim 1, wherein the thickness of the spacer layer is at least 10 Angstroms.

7. The magnetic tunnel junction device of claim 1, wherein the material of the spacer layer comprises one of Ta and MgO.

8. The magnetic tunnel junction device of claim 1, wherein a thickness of the second free layer is greater than a thickness of the first free layer.

9. The magnetic tunnel junction device of claim 1, wherein the magnetic tunnel junction device is in a memory cell and wherein a write current through the magnetic tunnel junction device changes a data value stored in the memory cell.

10. The magnetic tunnel junction device of claim 1, wherein magneto-striction in the first free layer is reduced by the second free layer.

11. The magnetic tunnel junction device of claim 1, wherein a first magnetic moment in the first free layer and a second magnetic moment in the second free layer are anti-parallel.

12. The magnetic tunnel junction device of claim 1, further comprising a capping layer, adjacent to the spin torque enhancement layer, wherein the capping layer forms a spin barrier but is not a pinning layer.

13. The magnetic tunnel junction device of claim 1, further comprising a spin accumulation layer between the spin torque enhancement layer and the second free layer.

14. The magnetic tunnel junction device of claim 1, wherein a thickness of the first free layer is between 15 and 20 Angstroms.

15. The magnetic tunnel junction device of claim 1, wherein a thickness of the second free layer is between 10 and 60 Angstroms.

16. The magnetic tunnel junction device of claim 1, wherein a thickness of the second free layer is between 15 and 40 Angstroms.

17. The magnetic tunnel junction device of claim 1, integrated in at least one semiconductor die.

18. The magnetic tunnel junction device of claim 1, further comprising at least one of: a set top box, a music player, a video player, an entertainment unit, a navigation device, a communications device, a personal digital assistant (PDA), a fixed location data unit, or a computer, into which the semiconductor device is integrated.

19. An apparatus, comprising:
a first free layer;
a second free layer; and
means for providing a spacer layer between the first free layer and the second free layer,
wherein the spacer layer substantially inhibits exchange coupling between the first free layer and the second free layer,
wherein the first free layer is magneto-statically coupled to the second free layer,
wherein an alignment of a magnetic moment of the first free layer relative to a fixed layer is controlled by a write current through the first free layer and the second free layer, and
wherein a thickness of the spacer layer is at least 4 Angstroms.

20. A method of manufacturing a magnetic tunnel junction device, the method comprising:
depositing a first free layer on a tunnel barrier layer of a magnetic tunnel junction structure, the first free layer comprising a first magnetically permeable material and having a first thickness;
depositing a spacer layer on the first free layer, the spacer layer comprising a substantially non-magnetically permeable insulator material and having a second thickness that substantially inhibits exchange coupling between the first free layer and a second free layer;
depositing the second free layer on the spacer layer, the second free layer comprising a second magnetically permeable material and having a third thickness; and
depositing a spin torque enhancement layer above the second free layer, the spin torque enhancement layer having a fourth thickness
wherein the second thickness of the spacer layer is at least 4 Angstroms.

21. The method of claim 20 further comprising depositing a Synthetic Anti-Ferromagnetic (SAF) layer between a substrate and the first free layer.

22. The method of claim 21, further comprising depositing an Anti-Ferromagnetic (AFM) pinning layer between the substrate and the SAF layer.

23. The method of claim 20, wherein the first free layer comprises a ferrous alloy.

24. The method of claim 20, wherein the second free layer comprises a ferrous alloy.

25. The method of claim 20, wherein at least one of the first free layer, the second free layer, and the spacer layer are deposited by a vapor deposition process.

26. The method of claim 20, wherein the spacer layer comprises two layers of one of Ta and MgO, Ta and Mg, and Ta and Ru.

27. The method of claim 20, wherein the spacer layer comprises one of AlCu, AlRu, and AlAg.

28. A method comprising:
a first step for depositing a first free layer on a tunnel barrier layer of a magnetic tunnel junction structure, the first free layer comprising a first magnetically permeable material and having a first thickness;
a second step for depositing a spacer layer on the first free layer, the spacer layer comprising a substantially non-magnetically permeable insulator material and having a second thickness that substantially inhibits exchange coupling between the first free layer and a second free layer;
a third step for depositing the second free layer on the spacer layer, the second free layer comprising a second magnetically permeable material; and
a fourth step for depositing a spin torque enhancement layer on the second free layer.

29. A non-transitory computer readable tangible medium storing instructions executable by a computer, the instructions comprising:
instructions that are executable by the computer to control depositing of a first free layer on a tunnel barrier layer of a magnetic tunnel junction structure, the first free layer comprising a first magnetically permeable material and having a first thickness;
instructions that are executable by the computer to control depositing of a spacer layer on the first free layer, the spacer layer comprising a substantially non-magnetically permeable insulator material and having a second thickness that substantially inhibits exchange coupling between the first free layer and a second free layer;
instructions that are executable by the computer to control depositing of a second free layer on the spacer layer, the second free layer comprising a second magnetically permeable material; and
instructions that are executable by the computer to control depositing of a spin torque enhancement layer on the second free layer.

30. A method comprising:
receiving, at a computer, design information representing at least one physical property of a semiconductor device, the semiconductor device comprising:

a first free layer;
a second free layer;
a spin torque enhancement layer; and
a spacer layer between the first free layer and the second free layer, the spacer layer comprising a material and having a thickness that substantially inhibits exchange coupling between the first free layer and the second free layer, and wherein the first free layer is magneto-statically coupled to the second free layer;
transforming, using the computer, the design information to comply with a file format; and
transformed design information.

31. A method comprising;
receiving a data file including design information corresponding to a semiconductor device, wherein the semiconductor device comprises:
a first free layer;
a second free layer;
a spin torque enhancement layer; and
a spacer layer between the first free layer and the second free layer, the spacer layer comprising a material and having a thickness that substantially inhibits exchange coupling between the first free layer and the second free layer, and wherein the first free layer is magneto-statically coupled to the second free layer; and
fabricating the semiconductor device according to the design information.

32. The method of claim 31, wherein the data file has a GDSII format.

33. A method comprising:
receiving, at a computer, design information including physical positioning information of a packaged semiconductor device on a circuit board, the packaged semiconductor device including a semiconductor structure comprising:
a first free layer;
a second free layer;
a spin torque enhancement layer; and
a spacer layer between the first free layer and the second free layer, the spacer layer comprising a material and having a thickness that substantially inhibits exchange coupling between the first free layer and the second free layer, and wherein the first free layer is magneto-statically coupled to the second free layer; and
transforming, using the computer, the design information to generate a data file.

34. The method of claim 33, wherein the data file has a GERBER format.

35. A method comprising:
receiving a data file with design information including physical positioning information of a packaged semiconductor device on a circuit board; and
manufacturing the circuit board configured to receive the packaged semiconductor device according to the design information, wherein the packaged semiconductor device comprises:
a first free layer;
a second free layer;
a spin torque enhancement layer; and
a spacer layer between the first free layer and the second free layer, the spacer layer comprising a material and having a thickness that substantially inhibits exchange coupling between the first free layer and the second free layer, and wherein the first free layer is magneto-statically coupled to the second free layer.

36. The method of claim 35, wherein the data file has a GERBER format.

37. The method of claim 35, further comprising integrating the circuit board into at least one of: a set top box, a music player, a video player, an entertainment unit, a navigation device, a communications device, a personal digital assistant (PDA), a fixed location data unit, or a computer.

* * * * *